(12) United States Patent
Ko

(10) Patent No.: US 11,729,910 B2
(45) Date of Patent: Aug. 15, 2023

(54) PRINTED CIRCUIT BOARD AND ELECTRONIC COMPONENT PACKAGE

(71) Applicant: SAMSUNG ELECTRO-MECHANICS CO., LTD., Suwon-si (KR)

(72) Inventor: Chan Hoon Ko, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/189,762

(22) Filed: Mar. 2, 2021

(65) Prior Publication Data

US 2022/0192017 A1 Jun. 16, 2022

(30) Foreign Application Priority Data

Dec. 11, 2020 (KR) .................. 10-2020-0173040

(51) Int. Cl.
*H05K 1/11* (2006.01)
*H05K 1/18* (2006.01)

(52) U.S. Cl.
CPC ............. *H05K 1/111* (2013.01); *H05K 1/185* (2013.01); *H05K 2201/10515* (2013.01); *H05K 2201/10674* (2013.01)

(58) Field of Classification Search
CPC .......... H05K 1/11; H05K 1/111; H05K 1/185; H05K 2201/10515; H05K 2201/10674

USPC .......................................................... 174/261
See application file for complete search history.

(56) References Cited

U.S. PATENT DOCUMENTS

2014/0146503 A1* 5/2014 Chino ................. H01L 21/4853
361/767
2022/0199879 A1* 6/2022 Shimizu ................. H01L 33/62

FOREIGN PATENT DOCUMENTS

JP       H05-13418 A       1/1993

* cited by examiner

*Primary Examiner* — Tremesha S Willis
(74) *Attorney, Agent, or Firm* — Morgan, Lewis & Bockius LLP

(57) ABSTRACT

A printed circuit board includes a substrate including an external connection pad; and a metal post extending to the outside of the substrate in a thickness direction of the substrate from the external connection pad. The metal post may include a first post portion, elongated while having a substantially constant width, a second post portion extending to the outside of the substrate in the thickness direction of the substrate while having a narrow width, and a third post portion extending to the outside of the substrate in the thickness direction of the substrate from the second post portion while having substantially the same width as the first post portion. The third post portion may form a lower end portion of the metal post.

23 Claims, 8 Drawing Sheets

PRINTED CIRCUIT BOARD AND ELECTRONIC COMPONENT PACKAGE

CROSS-REFERENCE TO RELATED APPLICATION(S)

This application claims benefit of priority to Korean Patent Application No. 10-2020-0173040 filed on Dec. 11, 2020 in the Korean Intellectual Property Office, the disclosure of which is incorporated herein by reference in its entirety.

TECHNICAL FIELD

The present disclosure relates to a printed circuit board and an electronic component package including the same.

BACKGROUND

As a pitch of nodes of a semiconductor chip is reduced, a pitch of connection pads formed on a printed circuit board connected to the semiconductor chip is also required to be made finer.

In addition, mobile products such as smartphones are required to have an improved quality while gradually becoming slimmer and lighter. In order to implement such demand, in the case of an electronic component package such as a ball grid array (BGA), a fine pitch is implemented using metal posts. However, when such an electronic component package is mounted on the printed circuit board using metal posts and solder, there may be a problem in that stress may be applied to the portions where the metal post is connected to the connection pad of the printed circuit board. Therefore, distribution of stress is required.

SUMMARY

An aspect of the present disclosure may provide a printed circuit board for distributing stress applied to metal posts and reducing manufacturing costs by reducing the use of a metal material.

Another aspect of the present disclosure may provide an electronic component package increasing a soldering area by forming groove portions to be soldered to metal posts having fine pitch spacing, distributing stress by increasing soldered contact points, and having high bonding stability of soldering.

According to an aspect of the present disclosure, a printed circuit board may include a substrate including an external connection pad; and a metal post extending to the outside of the substrate in a thickness direction of the substrate from the external connection pad. The metal post may include a first post portion, elongated while having a substantially constant width, a second post portion extending to the outside of the substrate in the thickness direction of the substrate while having a narrow width, and a third post portion extending to the outside of the substrate in the thickness direction of the substrate from the second post portion while having substantially the same width as the first post portion. The third post portion may provide a lower end portion of the metal post. The second post portion may have a width narrower than the first post portion and the third post portion.

According to another aspect of the present disclosure, a printed circuit board may include a substrate in which insulating layers and wiring patterns are stacked; an external connection pad disposed on an outermost layer of the substrate; a solder resist layer partially shielding the external connection pads; and a metal post extending outwardly from the solder resist layer. The metal post may include a contact post portion disposed on the solder resist layer, a first post portion extending on the solder resist layer and having a width greater than that of the contact post portion, a second post portion having a narrower width than the first post portion, and a third post portion extending from the second post portion and having a wider width than the second post portion.

According to another aspect of the present disclosure, an electronic component package may include a first substrate in which insulating layers and wiring patterns are stacked and including an external connection pad disposed on an outermost layer of the first substrate and a solder resist layer partially shielding the external connection pad; a metal post extending to the outside of the first substrate in a thickness direction of the first substrate from the external connection pad; a second substrate having external connection pads connected to the metal posts; and a semiconductor chip mounted on at least one of the first substrate and the second substrate. The metal post may include a contact post portion disposed on the solder resist layer, a first post portion extending on the solder resist layer and having a width greater than that of the contact post portion, a second post portion having a narrower width than the first post portion, and a third post portion extending from the second post portion and having a wider width than the second post portion.

According to another aspect of the present disclosure, a printed circuit board may include a substrate including a connection pad; an insulating layer disposed on the substrate and including an opening exposing a portion of the connection pad; and a metal post connected to the connection pad and protruding from the substrate. The metal post may include a groove portion on a side surface of the metal post and spaced apart from the insulating layer.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
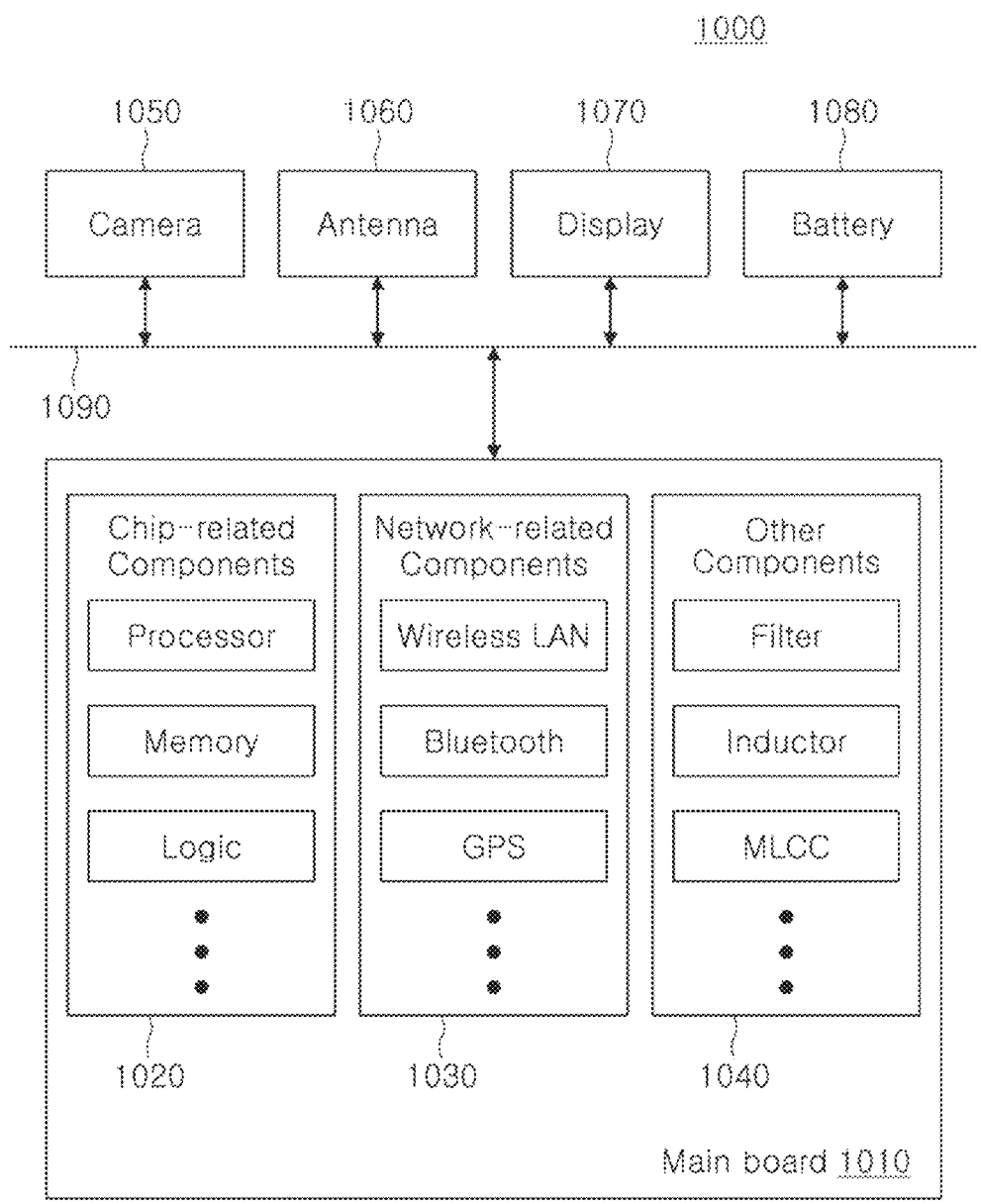
FIG. 1 is a schematic block diagram illustrating an example of an electronic device system.

Hereinafter, embodiments in the present disclosure will be described with reference to the accompanying drawings.

The embodiments in the present disclosure may be changed in various forms, and are provided to more completely describe to those of ordinary skill in the art. Accordingly, the shape and size of elements in the drawings may be exaggerated for clarity, and elements indicated by the same reference numerals in the drawings refer to the same elements.

In the present disclosure, the meaning of "connection" is a concept including "directly connected" as well as "indirectly connected" through other configurations. In addition, it is a concept including all "electrically connected" in some cases.

In the present disclosure, terms "first", "second", and the like, are used to distinguish one component from another component, and do not limit a sequence, importance, and the like, of the corresponding components. In some cases, a first component may be named a second component and a second component may also be similarly named a first component, without departing from the scope of the present disclosure.

The terms used in the present disclosure are used only to describe an example, and are not intended to limit the present disclosure. In this case, singular expressions include plural expressions unless the context clearly indicates otherwise.

Electronic Device System

FIG. 1 is a schematic block diagram illustrating an example of an electronic device system.

Referring to FIG. 1, an electronic device 1000 may accommodate a main board 1010 therein. The main board 1010 may include chip-related components 1020, network-related components 1030, other components 1040, and the like, physically and/or electrically connected thereto. These components may be connected to others to be described below to form various signal lines 1090.

The chip-related components 1020 may be a memory chip such as a volatile memory (for example, a DRAM), a non-volatile memory (for example, a ROM), a flash memory, or the like; an application processor chip such as a central processor (for example, a CPU), a graphics processor (for example, a GPU), a digital signal processor, a cryptographic processor, a microprocessor, a microcontroller, or the like; and a logic chip such as an ADC converter, an ASIC, or the like. However, the chip-related components 1020 are not limited thereto, and other types of chip-related components may be included in addition to such chips. In addition, these chip-related components may also be combined with each other. The chip-related components 1020 may be in the form of a package including the above-described chips.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with the chip-related components 1020 and provided in the form of a package.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components in the form of a chip component used for various other purposes, and the like. In addition, other components 1040 may be combined with the chip-related components 1020 and/or the network-related components 1030 and provided in the form of a package.

Depending on a type of the electronic device 1000, the electronic device 1000 may include other electronic components that may or may not be physically and/or electrically connected to the main board 1010. Examples of other electronic components may include a camera module 1050, an antenna module 1060, a display 1070, a battery 1080, and the like. However, other electronic components are not limited thereto, and may also include an audio codec, a video codec, a power amplifier, a compass, an accelerometer, a gyroscope, a speaker, a mass storage device (e.g., a hard disk drive), a compact disk (CD), a digital versatile disk (DVD), and the like. In addition, other electronic components used for various purposes may be included according to the type of the electronic device 1000.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive, or the like. However, the electronic device 1000 is not limited thereto, and may be any other electronic device that processes data.

Figure 2:
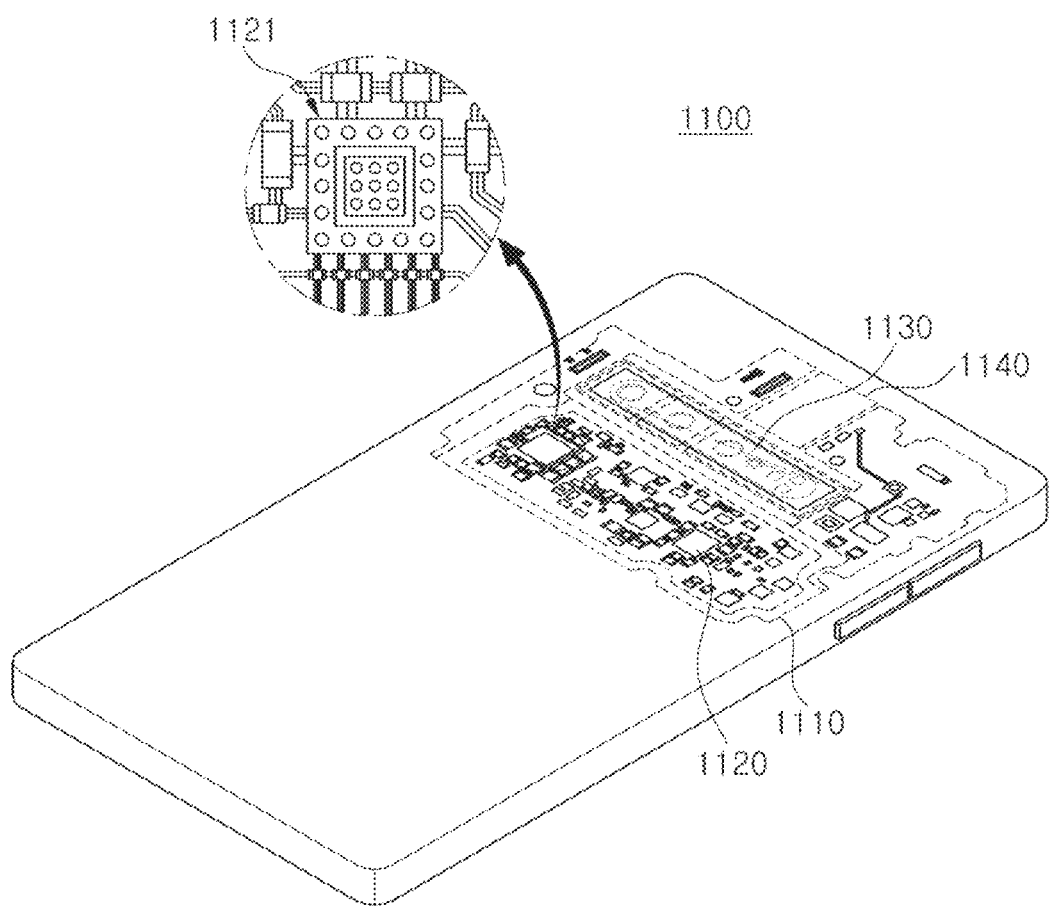
FIG. 2 is a schematic perspective view illustrating an example of an electronic device.

FIG. 2 is a schematic perspective view illustrating an example of an electronic device.

Referring to FIG. 2, the electronic device may be, for example, a smartphone 1100. A motherboard 1110 may be accommodated in the smartphone 1100, and various component packages 1120 may be physically and/or electrically connected to the mother board 1110. In addition, a camera module 1130 and/or a speaker 1140 may be accommodated in the smartphone 1110. Some of the component packages 1120 may be chip-related component packages 1121 in a form in which components are surface-mounted on a wiring board, and metal posts are arranged around the components to be connected to the motherboard 1110 by solder. On the other hand, the electronic device is not necessarily limited to the smartphone 1100, but may be other electronic devices as described above.

Printed Circuit Board

Figure 3:
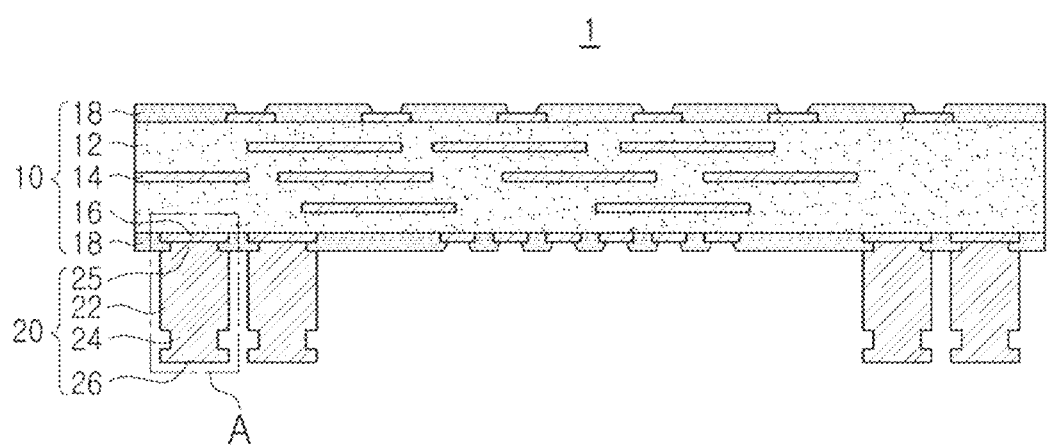
FIG. 3 is a schematic cross-sectional view illustrating a printed circuit board according to an embodiment in the present disclosure.
Figure 4A:
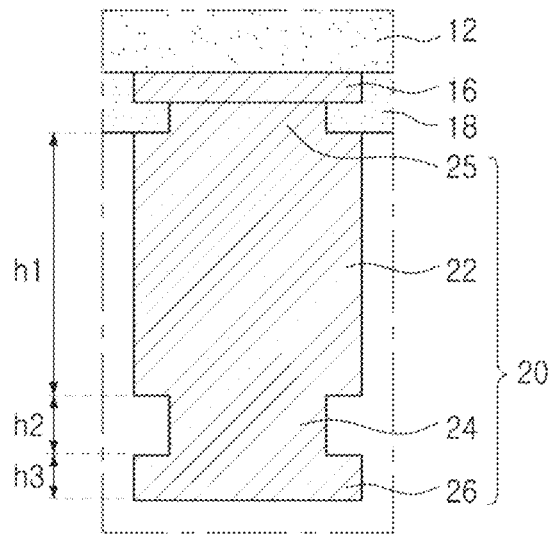
FIGS. 4A and 4B are schematic enlarged views illustrating a modified example of portion A of FIG. 3.
Figure 4B:
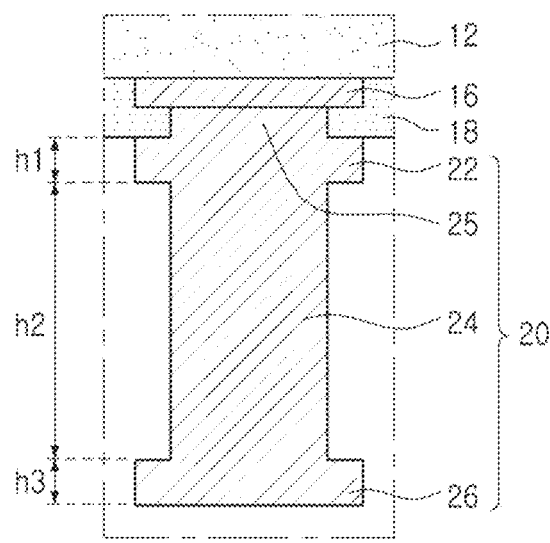

FIG. 3 is a schematic cross-sectional view illustrating a printed circuit board according to an embodiment in the present disclosure, and FIGS. 4A and 4B are schematic enlarged views illustrating a modified example of portion A of FIG. 3.

Referring to FIGS. 3, 4A, and 4B, a printed circuit board 1 according to an embodiment in the present disclosure may include a substrate unit (or a substrate) 10 and metal posts 20.

The substrate unit 10 may be formed by stacking a plurality of insulating layers 12 and wiring patterns 14 which are respectively disposed on or in the insulating layers 12 to transmit signals. The wiring pattern formed on the outermost layer is defined as an external connection pad 16, and a solder resist layer 18 may be disposed on the outermost layer of the insulating layers to partially shield the external connection pad 16. That is, the external connection pad 16 may be exposed to the outside through an opening formed in the solder resist layer 18. The solder resist layer 18 may function to protect the external connection pad 16 from soldering during manufacture of an electronic component package.

Here, a material of the insulating layer 12 may be an insulating material, and as the insulating material, a thermosetting resin such as an epoxy resin or a thermoplastic resin such as polyimide, and a material including inorganic filler such as silica and/or a reinforcing material such as glass fiber in these resins may be used. For example, as the material of the insulating layer, prepreg (PPG), copper clad laminate (CCL) insulating material, Ajinomoto Build-up Film (ABF), photo image-able dielectric (PID), and the like may be used. When the insulating layer is a plurality of layers, their materials may be the same or different from each other. In addition, when the insulating layer is a plurality of layers, the boundaries may be distinguished, but may not be distinguished.

A metal material may be used as the material of the wiring pattern 14 and the external connection pad 16. As the metal material, copper (Cu), aluminum (Al), silver (Ag), tin (Sn), gold (Au), nickel (Ni), lead (Pb), titanium (Ti), or alloys thereof may be used. The wiring patterns 14 and the external connection pads 16 may perform various functions depending on designs. For example, the wiring patterns 14 and the external connection pads 16 may include ground patterns, power patterns, signal patterns, and the like. Here, the signal patterns may include various signals except for the ground patterns and the power patterns, such as data signals, and the like. Each of the wiring patterns 14 may have a shape of a line, a plane, or a pad. The wiring patterns 14 and the external connection pads 16 may be formed by a plating process such as an additive process (AP), a semi AP (SAP), a modified SAP (MSAP), or a tenting (TT), and may thus each include a seed layer, which is an electroless plating layer, and an electrolytic plating layer formed based on the seed layer. A specific layer may further include copper foil.

An insulating material may be used as a material of the solder resist layer 18. In this case, a thermosetting resin such as an epoxy resin, a thermoplastic resin such as polyimide, and a material in which the thermosetting resin and the thermoplastic resin are mixed with inorganic filler such as silica, for example, an ABF may be used as the insulating material, but the insulating material is not limited thereto, and a solder resist including a photosensitive insulating material may also be used.

The metal post 20 may extend to the outside of the substrate unit 10 in a thickness direction of the substrate unit 10 from the external connection pad 16. The metal post 20 may have a fine pitch with an adjacent metal post, and a plurality of metal posts 20 may be exposed to the outside in the thickness direction in parallel from the substrate unit 10.

The metal post 20 may be a signal connection post, a power connection post, and/or a ground connection post depending on the function. The metal posts 20 may include at least one of conductive metal materials such as copper (Cu), aluminum (Al), nickel (Ni), titanium (Ti), tin (Sn), lead (Pb), silver (Ag), gold (Au), and alloys thereof. Each of the metal posts 20 may be formed by a plating process, for example, AP, SAP, MSAP, TT, etc., and may thus include a seed layer, which is an electroless plating layer, and an electrolytic plating layer formed based on the seed layer.

The metal post 20 may include a first post portion 22, a second post portion 24, and a third post portion 26 in an order adjacent to the substrate unit 10.

The first post part 22 may be elongated while having a substantially constant width, the second post portion 24 may extend to the outside of the substrate unit 10 in the thickness direction of the substrate unit 10 while having a narrow width, and the third post portion 26 may extend to the outside of the substrate unit in the thickness direction of the substrate unit from the second post portion 24 while having substantially the same width as the first post portion 22. The third post portion 26 may be a lower end portion of the metal post 20. The second post portion 24 may form a groove portion between the first post portion 22 and the third post portion 26. Here, "substantially constant" or "substantially the same" means that it is constant or the same in consideration of a process error occurring in a manufacturing process, a positional deviation during measurement, or an error.

The second post portion 24 may be a portion into which solder flows when the substrate unit 10 is mounted on another substrate unit. Accordingly, not only a bonding surface area between the solder and the metal post 20 may be increased, but also stress caused by a shear force of the metal post 20 may be distributed.

The metal post 20 may be provided with a contact post portion 25 having a width narrower than that of the first post portion 22 at a portion connected to the outermost layer pad 16 of the substrate unit 10.

FIGS. 4A and 4B are schematic enlarged views of portion A of FIG. 3, and illustrate different embodiments of the metal post 20.

Referring to FIG. 4A, the second post portion 24 of the metal post 20 of the present embodiment may be located below a center portion of the metal post 20, and a height h2 of the second post portion 24 may be smaller than a height h3 of the third post portion 26 and a height h1 of the first post portion 22.

Referring to FIG. 4B, the height h2 of the second post portion 24 of the metal post 20 of the present embodiment may be greater than the height h1 and h3 of at least one of the first post portion 22 and the third post portion 26. In addition, the second post portion 24 may also be located over all of the upper and lower portions of the center portion of the metal post 20.

As in the embodiments described above, the grooves portion formed by the second post portion 24 may be a portion into which solder flows. Accordingly, the bonding surface area between the solder and the metal post 20 may increase as well as the solder wicking in the groove portion of the second post part 24 during soldering, thereby increasing contact points between the solder and the metal post 20.

The increased bonding surface area and the increased contact points may allow stress caused by the shear force of the metal post 20 to be distributed in the metal post 20. In addition, the use of conductive metal materials can be reduced, which is advantageous for cost reduction.

FIGS. 5A through 5G are schematic process diagrams illustrating an example of manufacturing a printed circuit board.

FIGS. 5A through 5G illustrate an example for explaining a manufacturing method for manufacturing a printed circuit board according to an embodiment in the present disclosure. Each process may be conducted in a different order, unless the context clearly indicates a specific order.

Figure 5A:
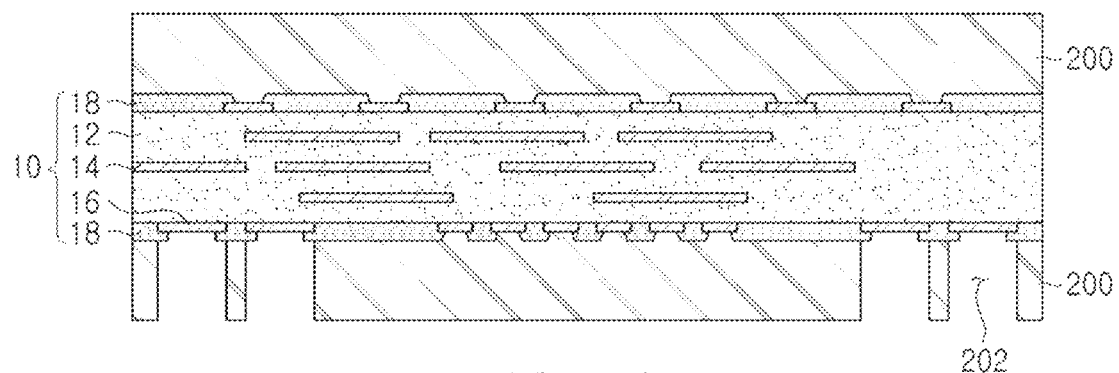
FIGS. 5A through 5G are schematic process diagrams illustrating an example of manufacturing a printed circuit board.

In FIG. 5A, a substrate unit 10 in which insulating layers 12 and wiring patterns 14 are stacked may be provided. The outermost layer of the substrate unit 10 may be provided with external connection pads 16 for connecting to external electronic components and solder resist layers 18 for partially shielding the external connection pads 16. A dry film 200 may be stacked on both surfaces of the substrate unit 10, and the dry film 200 may be exposed and developed to form first pattern hole 202 for forming a metal post. The first pattern hole 202 may expose the external connection pads 16.

Figure 5B:
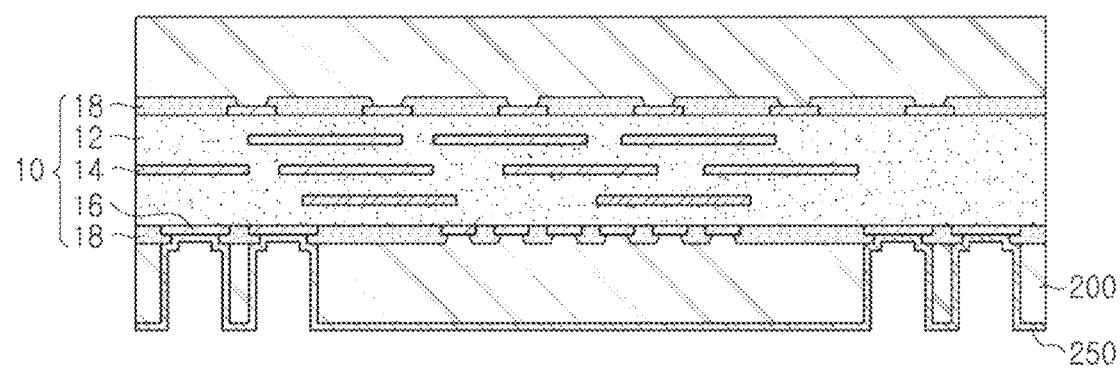
Figure 5C:
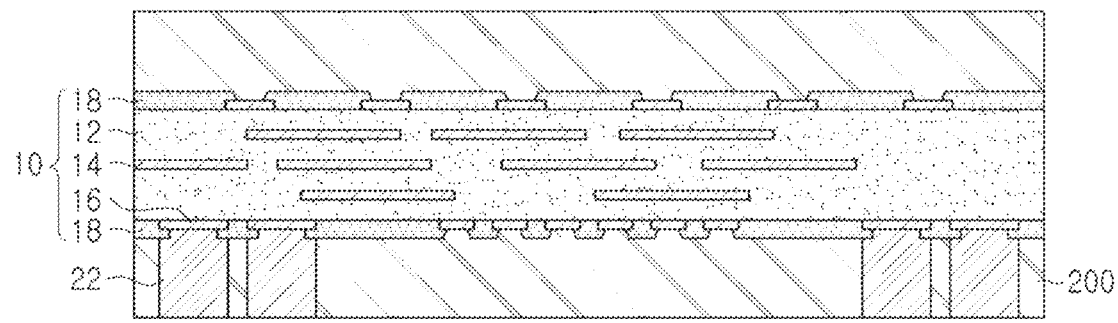

In FIGS. 5B and 5C, a seed layer 250 for plating may be formed along the first pattern hole 202 formed in the dry film 200, and the first pattern hole 202 may be filled with metal through a plating process to form the contact post portion 25 and the first post portion 22.

Figure 5D:
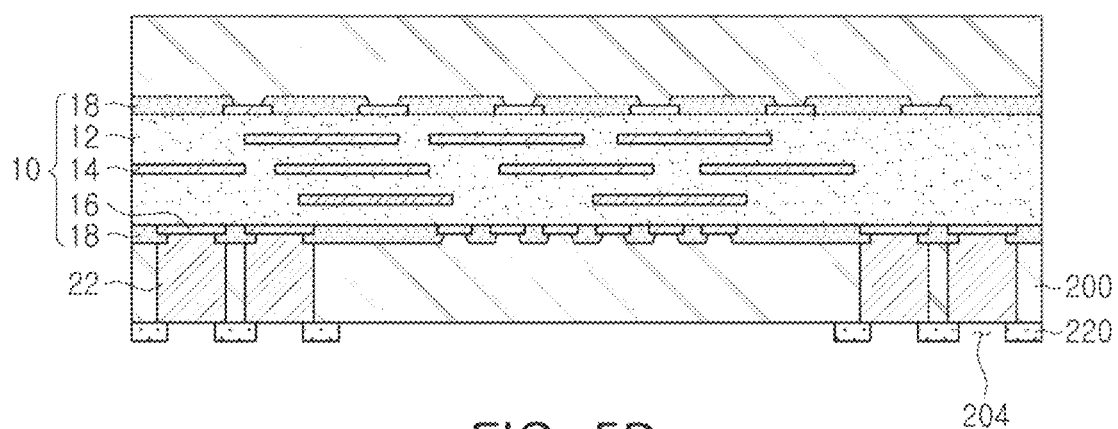
Figure 5E:
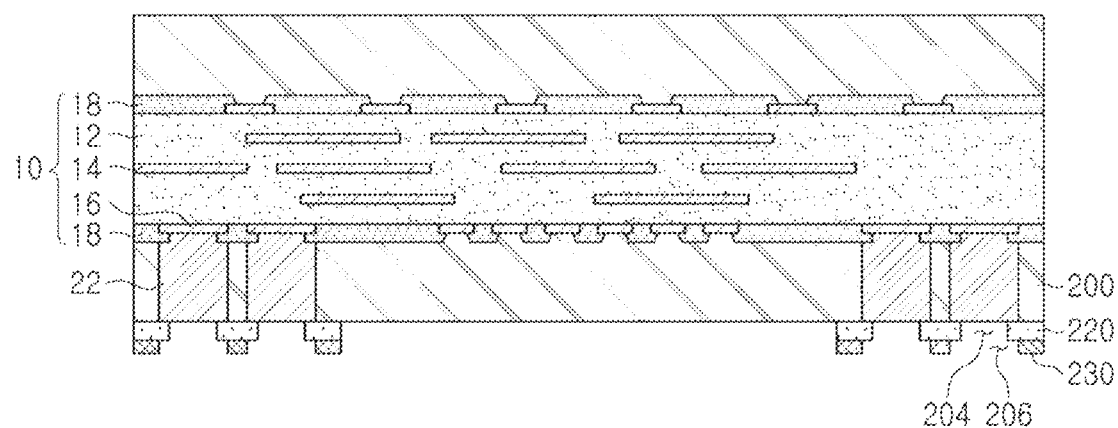

FIGS. 5D and 5E, additional dry films 220 and 230 may be stacked on the dry film 200. In addition, a second pattern hole 204 for forming a second post portion and a third pattern hole 206 for forming a third post portion in the additional dry films 220 and 230 may be processed using a photolithography process or the like. Here, the second pattern hole 204 may be narrower in width than the third pattern hole 206, and the width of the third pattern hole 106 may be substantially the same as the width of the first pattern hole 202.

Figure 5F:
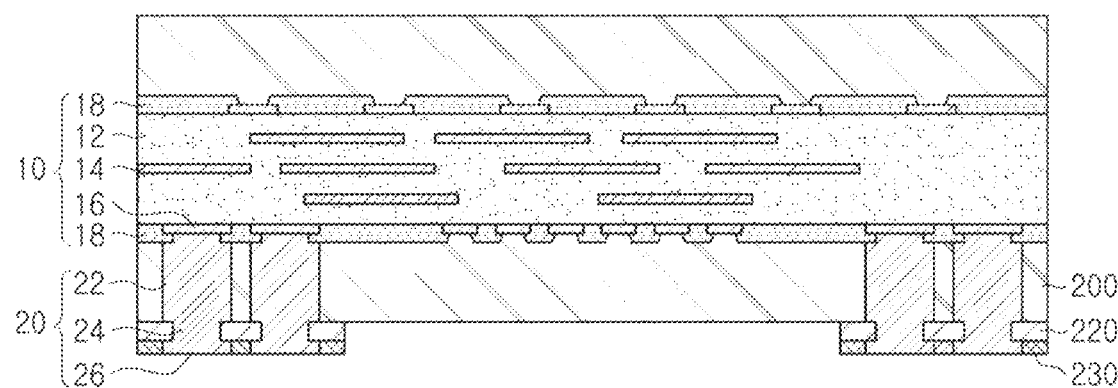

In FIG. 5F, the second and third pattern holes 204 and 206 may be filled with metal through a plating process to form the second post portion 24 and the third post portion 26.

Figure 5G:
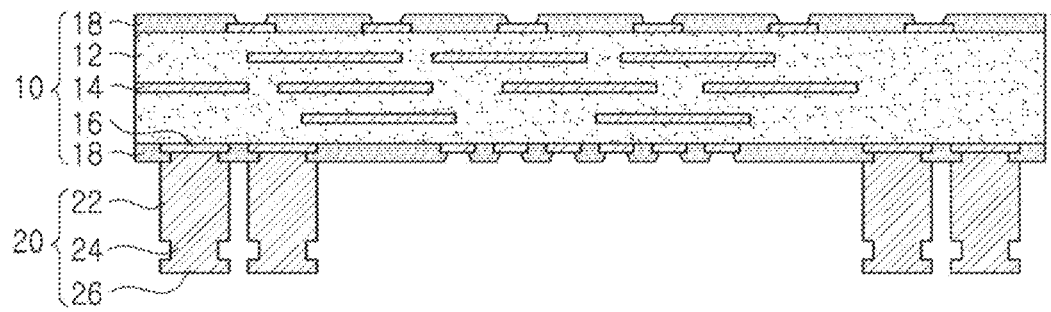

In FIG. 5G, by peeling the dry films 200, 220, and 230, the printed circuit board 1 according to the above-described example may be manufactured. A height of the second pattern hole 204 may be selectively adjusted. Other overlapping contents are omitted.

Referring again to FIGS. 1 through 5G, an example of the disclosed printed circuit board 1 will be described again.

The printed circuit board 1 may include the substrate unit 10, the external connection pads 16, the solder resist layers 18 and the metal posts 20.

The substrate unit 10 may be formed by stacking the insulating layers 12 and the wiring patterns 14, the external connection pads 16 may be formed on the outermost layer of the substrate unit 10, and the solder resist layers 18 may be formed to partially shield the external connection pads 16.

The metal post 20 may include the contact post portion 25 extending outwardly from the solder resist layer 18 and formed on the solder resist layer 18, the first post portion 22 extending on the solder resist layer 18 and having the width greater than that of the contact post portion 25, the second post portion 24 having the narrower width than the first post portion 22, and the third post portion 26 extending from the second post portion 24 and having a wider width than the second post portion 24.

The widths of the first post portion 22 and the third post portion 26 may be substantially the same. Here, "substantially the same" means that it is the same including a process error occurring in a manufacturing process, a positional deviation during measurement, or an error.

In an embodiment of the metal post 20 of FIG. 4A, the second post portion 24 may be located below the center portion of the metal post 20, and the height of the second post portion 24 may be smaller than the height of the third post portion 24.

In an embodiment of the metal post 20 of FIG. 4B, the second post portion 24 may be located at the upper and lower portions of the center portion of the metal post 20, and the height of the second post portion 24 may be greater than the height of at least one of the first post portion and the third post portion.

Meanwhile, the metal post 20 may include at least one of materials such as copper (Cu), aluminum (Al), nickel (Ni), titanium (Ti), tin (Sn), lead (Pb), silver (Ag), gold (Au), and alloys thereof.

Electronic Component Package

Figure 6:
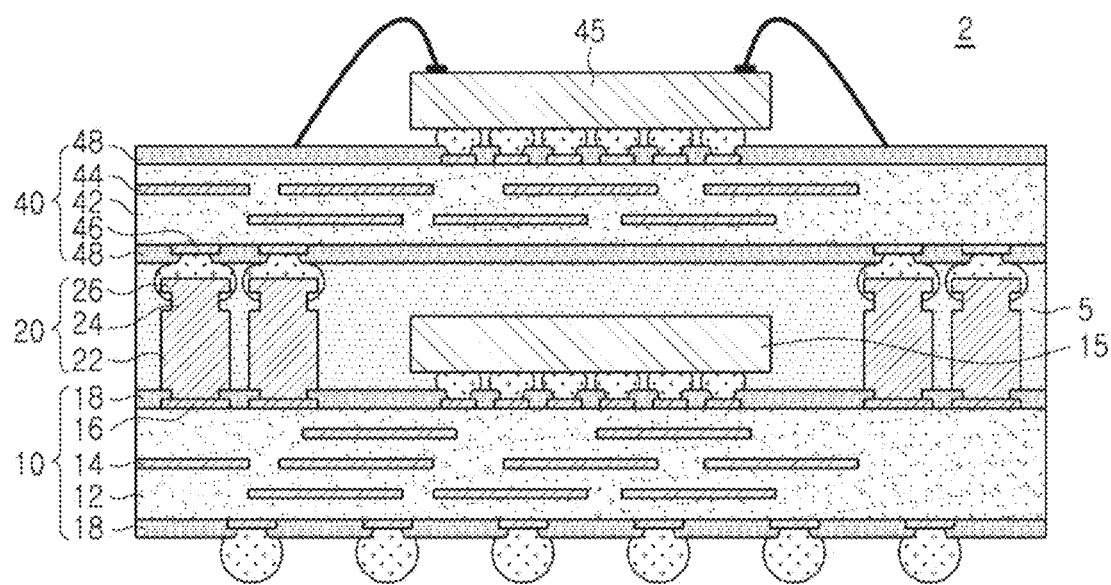
FIG. 6 is a schematic cross-sectional view illustrating an electronic component package on which the printed circuit board is mounted according to an embodiment in the present disclosure.

FIG. 6 is a schematic cross-sectional view illustrating an electronic component package on which the printed circuit board is mounted according to an embodiment in the present disclosure.

Referring to FIG. 6, an electronic component package 2 according to an embodiment in the present disclosure may be a semiconductor chip package including a first substrate unit (or a first substrate) 10, the metal posts 20, a second substrate unit (or a second substrate) 40, and semiconductor chips 15 and 45.

The second substrate unit 40 may also be formed by stacking insulating layers 42 and wiring patterns 44, and external connection pads 46 and solder resistor layers 48 for partially shielding the external connection pads 46 may be formed on the outermost layer of the second substrate unit 40. The first substrate unit 10 and the second substrate unit 40 can be replaced with the contents of the printed circuit board 1 described above. Here, an embodiment in which the metal post 20 extends from the first substrate unit 10 and is connected to the external connection pad 46 of the second substrate unit 40 is disclosed, but the metal post 20 may extend from the second substrate unit 40.

The metal posts 20 may be connected to the external connection pads 46 of the second substrate unit 40 by soldering. Since the soldering is wicked in the groove portion of the second post portion 24, the contact area between the solder and the metal posts 20 may increase, and the contact point may also increase, thereby distributing stress to several points when a shear force occurs.

The semiconductor chips 15 and 45 may be mounted on at least one of the first substrate unit 10 and the second substrate unit 40. As illustrated in FIG. 6, the semiconductor chip 15 may be mounted on the first substrate unit 10 and disposed in a space between the first substrate unit 10 and the second substrate unit 40. Another semiconductor chip 45 may be mounted on the second substrate unit 40.

After the semiconductor chip 15 is disposed in the space between the first substrate unit 10 and the second substrate unit 40, the space may be filled with an encapsulant 5. An insulating material may be used as the encapsulant, and a thermosetting resin such as an epoxy resin or a thermoplastic resin such as polyimide may be used as the insulating material. In addition, a material containing an inorganic filler such as silica in these resins may be used. For example, as the material of the encapsulant, ABF may be used. However, the material of the encapsulant is not limited thereto, and other types of epoxy molding compound (EMC) may be used, and photo image-able dielectric (PID) may be used.

The semiconductor chips 15 and 45 may be connected to the external connection pads of the printed circuit board by wire bonding or flip chip bonding.

As set forth above, according to the embodiments in the present disclosure, the printed circuit board according to the present disclosure may distribute stress applied to the metal posts and reduce manufacturing cost by reducing the use of the metal material.

Further, the electronic component package according to the present disclosure may increase the soldering area by forming the groove portions to be soldered to the metal posts having the fine pitch spacing, distribute stress by increasing the soldered contact points, and have the high bonding stability of soldering.

While exemplary embodiments have been shown and described above, it will be apparent to those skilled in the art that modifications and variations could be made without departing from the scope of the present invention as defined by the appended claims.

What is claimed is:

1. A printed circuit board comprising:
a substrate including an external connection pad; and
a metal post extending to the outside of the substrate in a thickness direction of the substrate from the external connection pad,
wherein:
the metal post includes:
a first post portion,
a second post portion extending to the outside of the substrate in the thickness direction of the substrate, and
a third post portion extending to the outside of the substrate in the thickness direction of the substrate from the second post portion,
the third post portion provides a lowest end portion of the metal post,
the second post portion has a width narrower than the first post portion and the third post portion, and
at least a portion of the second post portion is exposed from the first post portion.

2. The printed circuit board of claim 1, wherein the first post portion is elongated while having a substantially constant width, and
the third post portion has substantially the same width as the first post portion.

3. The printed circuit board of claim 1, wherein a contact post portion of the metal post connected to the external connection pad has a width narrower than that of the first post portion.

4. The printed circuit board of claim 1, wherein the second post portion is farther away from the external connection pad, with respect to a center portion of the metal post, and
a height of the second post portion is smaller than that of the third post portion.

5. The printed circuit board of claim 1, wherein a height of the second post portion is greater than that of at least one of the first post portion and the third post portion.

6. The printed circuit board of claim 1, wherein the metal post includes at least one of copper (Cu), aluminum (Al), nickel (Ni), titanium (Ti), tin (Sn), lead (Pb), silver (Ag), and gold (Au).

7. A printed circuit board comprising:
a substrate in which insulating layers and wiring patterns are stacked;
an external connection pad disposed on an outermost layer of the substrate;
a solder resist layer partially shielding the external connection pad; and
a metal post extending outwardly from the solder resist layer in a thickness direction of the substrate,
wherein:
the metal post includes a contact post portion disposed on the solder resist layer, a first post portion extending on the solder resist layer and having a width greater than that of the contact post portion, a second post portion having a narrower width than the first post portion, and a third post portion extending from the second post portion and having a wider width than the second post portion,
the second post portion is arranged between the first post portion and the third post portion in the thickness direction, and
at least a portion of the second post portion is exposed from the first post portion.

8. The printed circuit board of claim 7, wherein the first post portion and the third post portion have substantially the same width.

9. The printed circuit board of claim 7, wherein the second post portion is located farther away from the external connection pad, with respect to a center portion of the metal post, and
a height of the second post portion is smaller than that of the third post portion.

10. The printed circuit board of claim 7, wherein the second post portion is located at upper and lower portions of the metal post, and
a height of the second post portion is greater than that of at least one of the first post portion and the third post portion.

11. The printed circuit board of claim 7, wherein the metal post includes at least one of copper (Cu), aluminum (Al), nickel (Ni), titanium (Ti), tin (Sn), lead (Pb), silver (Ag), and gold (Au).

12. An electronic component package comprising:
a first substrate in which insulating layers and wiring patterns are stacked and including a first external connection pad disposed on an outermost layer of the first substrate and a solder resist layer partially shielding the first external connection pad;
a metal post extending to the outside of the first substrate in a thickness direction of the first substrate from the first external connection pad;
a second substrate having a second external connection pad connected to the metal post; and
a semiconductor chip mounted on at least one of the first substrate or the second substrate,
wherein:
the metal post includes a contact post portion disposed on the solder resist layer, a first post portion extending on the solder resist layer and having a width greater than that of the contact post portion, a second post portion having a narrower width than the first post portion, and a third post portion extending from the second post portion and having a wider width than the second post portion,
the second post portion is arranged between the first post portion and the third post portion in the thickness direction, and
at least a portion of the second post portion is covered by an insulating material.

13. The electronic component package of claim 12, wherein the first post portion and the third post portion have substantially the same width.

14. The electronic component package of claim 12, wherein the second post portion is located farther away from the first external connection pad of the first substrate, with respect to a center portion of the metal post, and
a height of the second post portion is smaller than that of the third post portion.

15. The electronic component package of claim 12, wherein the second post portion is located at upper and lower portions of the metal post, and a height of the second post portion is greater than that of at least one of the first post portion and the third post portion.

16. The electronic component package of claim 12, wherein a height of the second post portion is greater than that of at least one of the first post portion and the third post portion.

17. A printed circuit board comprising:
a substrate including a connection pad thereon and a wiring pattern therein;
an insulating layer disposed on the substrate and including an opening exposing a portion of the connection pad; and
a metal post connected to the connection pad and protruding from the substrate,
wherein:
the metal post includes a groove portion on a side surface of the metal post and spaced apart from the insulating layer,
at least a portion of the groove portion is exposed from a portion of the metal post, and
the connection pad and the metal post overlap each other along a thickness direction of the substrate.

18. The printed circuit board of claim 17, wherein the groove portion is disposed between portions of the metal post, and one or more of the portions of the metal post have a substantially constant width.

19. The printed circuit board of claim 17, wherein the metal post includes a contact post portion disposed in the opening of the insulating layer and extending from the connection pad, and
the contact post portion has a width narrower than another portion of the metal post connected to the groove portion.

20. The printed circuit board of claim 17, wherein the groove portion is farther away from the connection pad, with respect to a center portion of the metal post.

21. The printed circuit board of claim 17, wherein the metal post includes at least one of copper (Cu), aluminum (Al), nickel (Ni), titanium (Ti), tin (Sn), lead (Pb), silver (Ag), and gold (Au).

22. The printed circuit board of claim 1, wherein the external connection pad, the first post portion, the second post portion, and the third post portion overlap each other along the thickness direction of the substrate.

23. The electronic component package of claim 12, wherein at least the portion of the second post portion is directly covered by the insulating material.

* * * * *